(12) United States Patent
Atoro et al.

(10) Patent No.: US 8,008,905 B2
(45) Date of Patent: Aug. 30, 2011

(54) WAVEFORM OBSERVING APPARATUS

(75) Inventors: Takashi Atoro, Osaka (JP); Shinya Asada, Osaka (JP)

(73) Assignee: Keyence Corporation, Osaka (JP)

( * ) Notice: Subject to any disclaimer, the term of this patent is extended or adjusted under 35 U.S.C. 154(b) by 244 days.

(21) Appl. No.: 12/502,314

(22) Filed: Jul. 14, 2009

(65) Prior Publication Data

US 2010/0026277 A1    Feb. 4, 2010

(30) Foreign Application Priority Data

Aug. 1, 2008  (JP) ................. 2008-199404

(51) Int. Cl.
*G01R 23/16*  (2006.01)

(52) U.S. Cl. ................. 324/76.12; 324/115; 324/750.15

(58) Field of Classification Search .......... None
See application file for complete search history.

(56) References Cited

U.S. PATENT DOCUMENTS 5,784,285 A * 7/1998 Tamaki et al. .................. 702/66
6,512,355 B1 * 1/2003 Kinne et al. ................. 324/71.1

FOREIGN PATENT DOCUMENTS

| JP | 07-114349 | 5/1995 |
| JP | 2002-082133 | 3/2002 |

* cited by examiner

*Primary Examiner* — Huy Phan
*Assistant Examiner* — Trung Q Nguyen
(74) *Attorney, Agent, or Firm* — Kilyk & Bowersox, P.L.L.C.

(57) ABSTRACT

There is provided a waveform observing apparatus with a reduced depth in such a manner that the waveform observing apparatus is one including a terminal board, connecting wiring extending from external equipment, a memory for receiving measured data through the terminal board, to store the measured data, and a display for displaying the measured data in waveform, the apparatus including: a first intra-body substrate, installed in an erect state inside a body frame of the waveform observing apparatus; a plurality of first connectors, provided on the first intra-body substrate; and a measurement module, which is connector-connected to the first connector of the first intra-body substrate, to be installed between the first intra-body substrate and the terminal board, and also includes a measurement circuit, wherein a plurality of measurement modules are detachable in an aligned state with respect to the erect first intra-body substrate.

5 Claims, 16 Drawing Sheets

WAVEFORM OBSERVING APPARATUS

CROSS-REFERENCE TO RELATED APPLICATIONS

The present application claims foreign priority based on Japanese Patent Application No. 2008-199404, filed Aug. 1, 2008, the contents of which is incorporated herein by reference.

BACKGROUND OF THE INVENTION

1. Field of the Invention

The present invention relates to a waveform observing apparatus.

2. Description of the Background Art

There has been used a waveform observing apparatus for observing a temperature and pressure of equipment on a factory production line. The apparatus historically used to be one for writing a waveform on rolled paper, but with the development of electronic equipment, a waveform observing apparatus that displays a waveform by use of a display in place of paper is currently in wide use.

The waveform observing apparatus is capable of displaying in a display section a constantly varying measured value, namely a time-series waveform, while storing measured data captured from a thermocouple or the like into a memory mounted to the waveform observing apparatus. For example, Japanese Patent Application Laid-Open No. H7-114349 and Japanese Patent Application Laid-Open No. 2002-82133 each disclose a waveform observing apparatus having a display with a touch panel. Japanese Patent Application Laid-Open No. H7-114349 proposes that, by an operator touching a function key displayed in a display section, a function designated by the function key displayed in the display section is executed. Japanese Patent Application Laid-Open No. 2002-82133 displays that, while a displayed waveform is observed, an operation of inputting a comment or a marking by pen-input is performed using a pen-input touch screen.

As for a conventional practical article of the waveform observing apparatus of this kind, a configuration has been adopted to have a solid metal-made frame and install a substrate incorporated with a measurement circuit, a computing circuit and the like in this metal frame. Further, in the conventional article, a terminal board corresponding to the number of channels requested by a user has been incorporated based upon this requested number of channels.

SUMMARY OF THE INVENTION

In general, the waveform observing apparatus is often used as being incorporated in a control board, and its height size and width size are typically defined to two kinds, for example. Therefore, with a certain degree of flexibility given to its depth size, the conventional practical article has not been sufficiently worked on in terms of reduction in depth size.

Further, since a technique of mounting terminal boards in accordance with the number of channels requested by the user has been adopted to the conventional practical article, there has been a problem in that, when the number of channels requested increases after the mounting, the user has a difficulty dealing with that increase.

An object of the present invention is to provide a waveform observing apparatus capable of reducing its depth size.

A further object of the present invention is to provide a waveform observing apparatus capable of immediately dealing with a subsequent variation in number of channels made by a user, having acquired the waveform observing apparatus, after the acquirement of the apparatus.

According to the present invention, the above technical problems are solved by providing a waveform observing apparatus, including a terminal board, connecting wiring extending from external equipment, a memory for receiving measured data through the terminal board, to store the measured data, and a display for displaying the measured data in waveform, the apparatus including:

a first intra-body substrate, installed in an erect state inside a body frame of the waveform observing apparatus;

a plurality of first connectors, provided on the first intra-body substrate; and a measurement module, which is connector-connected to the first connector of the first intra-body substrate, to be installed between the first intra-body substrate and the terminal board, and also includes a measurement circuit, wherein a plurality of measurement modules are detachable in an aligned state with respect to the erect first intra-body substrate.

Namely, according to the present invention, a first intra-body substrate that connector-connects a measurement module is arranged in an erect state, thereby allowing reduction in depth size of the waveform observing apparatus as compared with a case where this is arranged in the horizontal direction. Further, since preparing a plurality of first connectors on the intra-body substrate in the erect state can connect an arbitrary number of measurement modules, when the number of channels requested by the user increases or decreases, it is possible to deal with this by increasing or decreasing the number of measurement modules in accordance with the increase or decrease in the requested number.

In a preferred embodiment of the present invention, the measurement module and the terminal board are mutually connector-connected to constitute a measurement unit, and the terminal board is detachably fixed to walls of the body frame. With such a configuration adopted, a load of the terminal board connected with a large number of wiring can be applied on the body frame, and it is thus possible to suppress action of the load of the terminal board on the intra-body substrate in the erect state.

According to the preferred embodiment of the present invention, the measurement module houses two intra-module substrates vertically separately disposed inside a module case of the measurement module, out of the two intra-module substrates, one intra-module substrate is installed with a second connector connector-connectable to the intra-body substrate, and the other intra-module substrate is installed with a third connector connector-connectable to the terminal board, and out of the two intra-module substrates, either one is freely movably supported within a predetermined and fixed range with respect to the module case.

According to this embodiment, out of two intra-module substrates inside the measurement module, a floating support structure is adopted to one substrate, while second and third connectors on the terminal board side and the body side are mounted on the other intra-module substrate, and it is thereby possible to suppress transmission of the load from the terminal board to the body-side substrate.

Other objects and the action effects thereof become apparent from the following detailed descriptions of preferred embodiments of the present invention.

DESCRIPTION OF THE PREFERRED EMBODIMENTS

Figure 1:
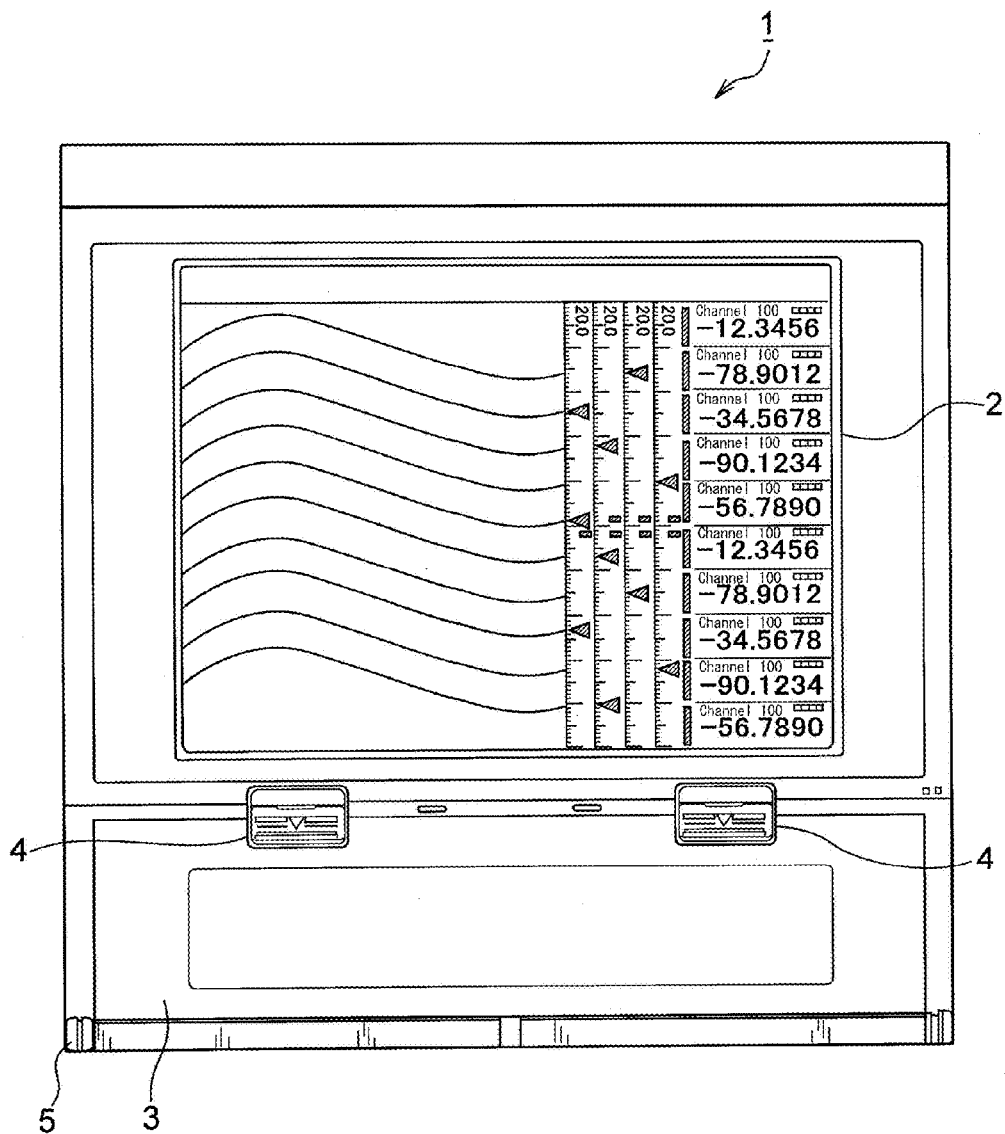
FIG. 1 is a front view of a waveform observing apparatus of an embodiment.
Figure 2:
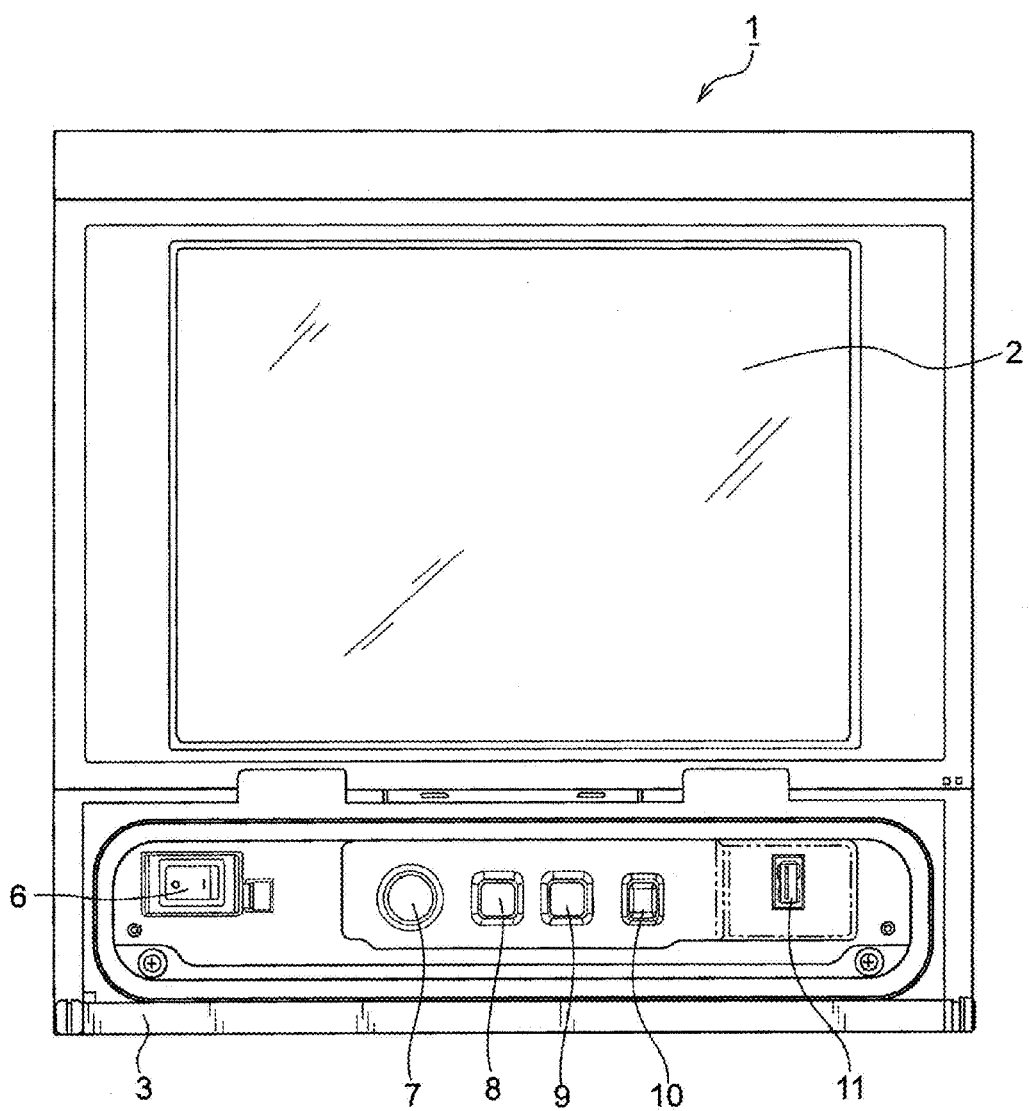
FIG. 2 is a front view of the waveform observing apparatus of the embodiment as in FIG. 1, as well as a view showing a state in which a waterproof cover provided under a display is open.

In the following, a preferred embodiment of the present invention is described with reference to attached drawings. FIG. 1 is a front view of a waveform observing apparatus 1 of an embodiment. The waveform observing apparatus 1 has a top-open waterproof cover 3 with a lower hinge below a display section 2, and the waterproof cover 3 can be opened with a lower hinge 5 at the center by releasing a slide lock 4. FIG. 2 shows a state where the waterproof cover 3 is open. As seen from this FIG. 2, opening the waterproof cover 3 can expose a main power switch 6, a start/stop switch button 7, a setting menu button 8, a user setting key button 9, a touch panel function lock switch button 10, and a USB connector 11.

The start/stop switch button 7 can be operated by the user, to start and stop collection of measured data. The setting menu button 8 can be operated by the user, to display a setting menu and display predetermined setting items from the setting menu. The user setting key button 9 can be arbitrarily allocated by the user, and the user setting key button 9 can be operated, to execute a function allocated by the user. As described later, the waveform observing apparatus 1 of the embodiment has a touch panel (numeral 222 in FIG. 3), and the touch panel function lock switch button 10 can stop the function of this touch panel 222, to cancel out an input made by means of the touch panel 222.

Figure 3:
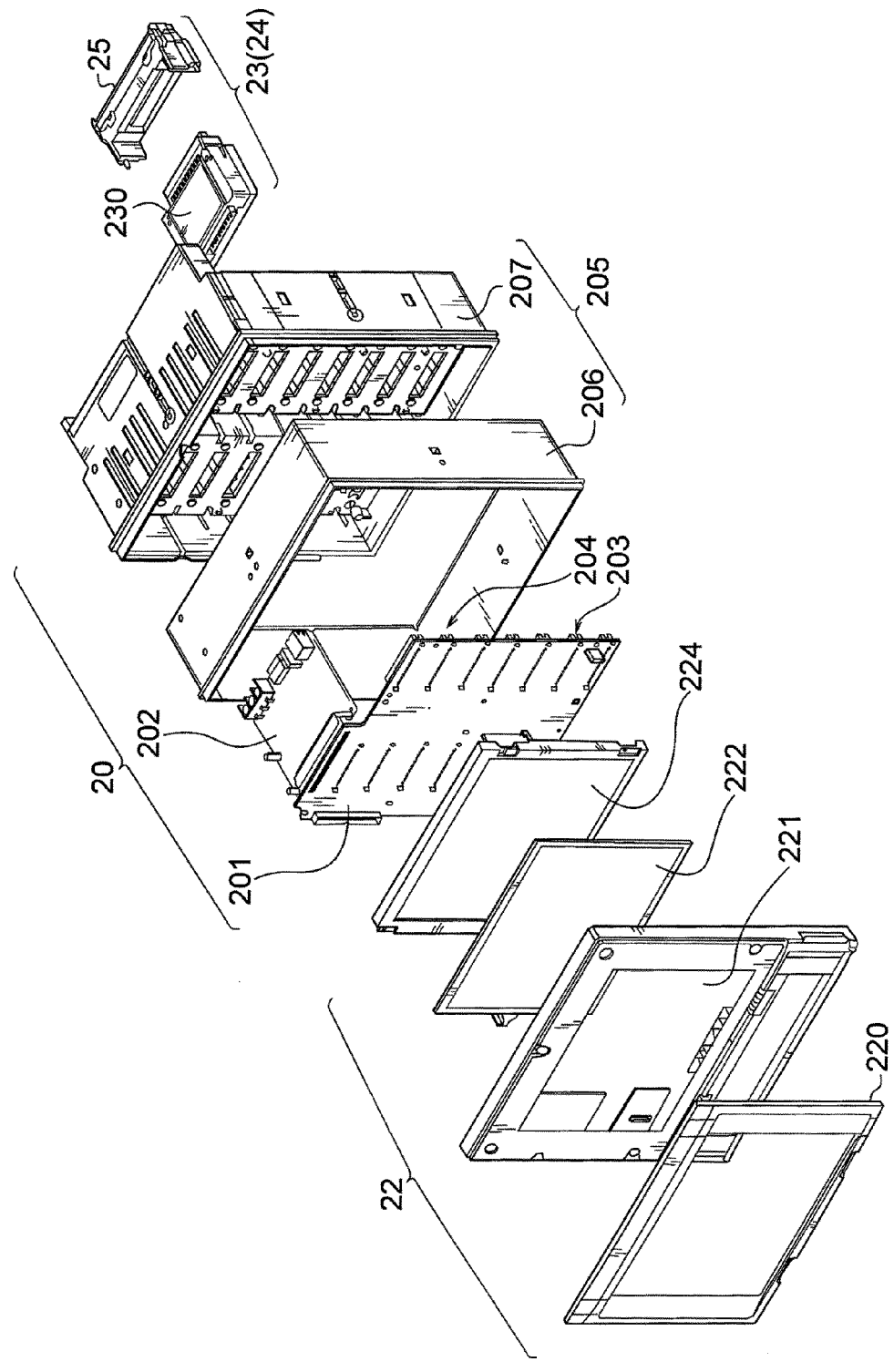
FIG. 3 is an exploded perspective view of the waveform observing apparatus of the embodiment.
Figure 4:
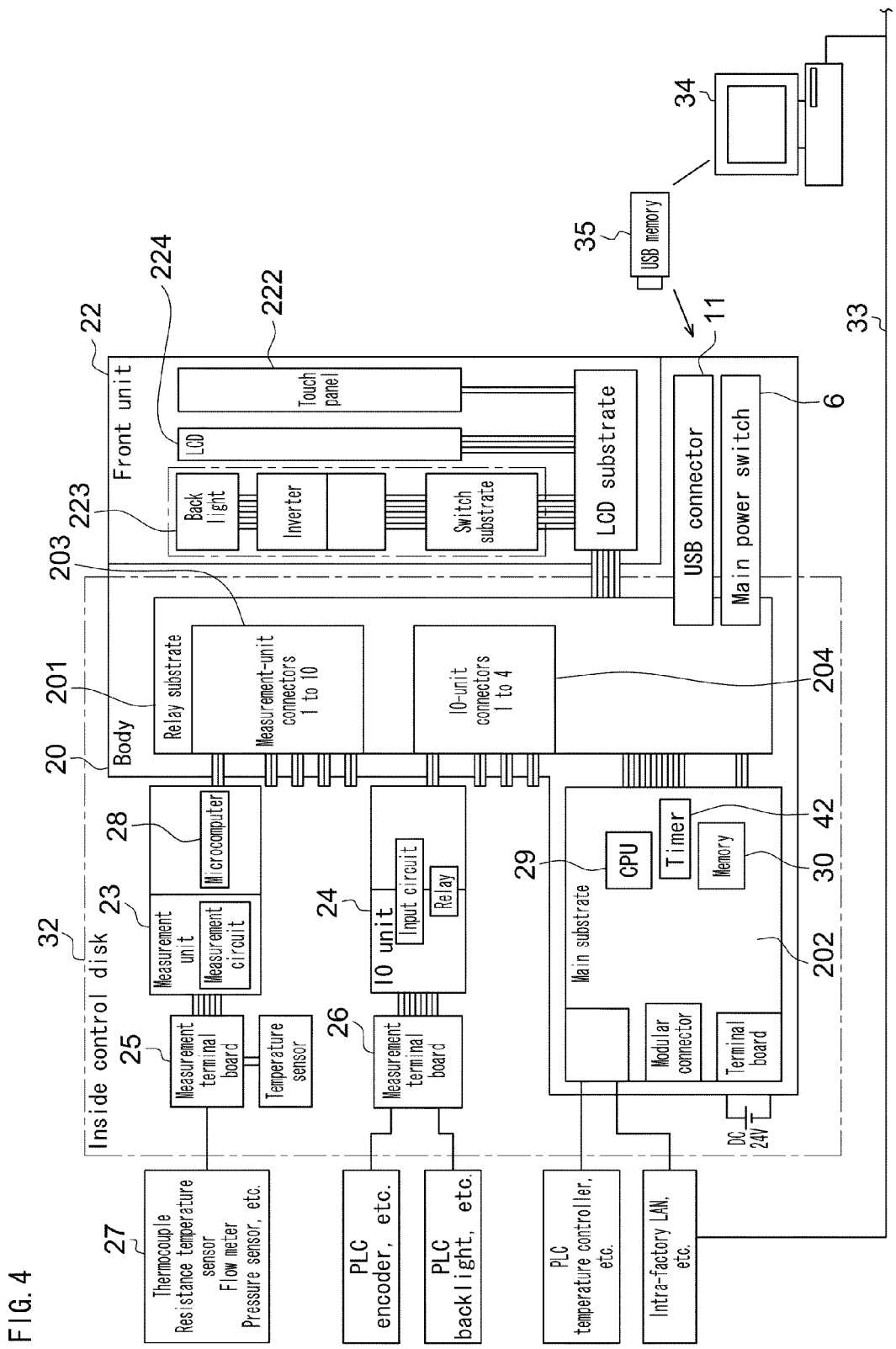
FIG. 4 is a block diagram of the waveform observing apparatus of the embodiment.

FIG. 3 is an exploded perspective view of the waveform observing apparatus 1, and FIG. 4 is a block diagram of the same. The waveform observing apparatus 1 includes a body 20 and a detachable front unit 22 on the front surface of the body 20. The front unit 22 is made up of a cosmetic panel 220, a front surface frame 221, a touch panel 222, and a liquid display 224 having a back light 223 (FIG. 4). The touch panel 222 and the liquid display 224 with the back light constitute the display section 2, and a waveform chart is displayed in the display section 2 as shown in the figure. Needless to say, the liquid display 224 is an example of the slim-type display.

A waterproof and protective sheet is provided as stretched over the cosmetic panel 220, and with this waterproof and protective sheet provided as stretched over the cosmetic panel 220, the terminal of the waterproof and protective sheet can be hidden by the front unit 22, so as to improve the appearance of the waveform observing apparatus 1.

The apparatus body 20 has a relay substrate 201 located in an erect state on its front surface, and a main substrate 202 that is connector-connected to the upper end of the relay substrate 201 and extends in the horizontal direction. The relay substrate 201 serves to supply a digitalized measurement signal to the main substrate 202 mounted with a CPU 29 as a control device, and is installed with ten measurement-unit connectors 203 and a total of four alarm-or-IO-unit connectors 204. The relay substrate 201 and the main substrate 202 are housed inside a body frame 205, as detailed later.

The relay substrate 201 constituting a first intra-body substrate is also installed with a power switch 16 and USB connector 11. The main power switch 6 and the USB connector 11 are connected to the main substrate 202 constituting a second intra-body substrate, through the relay substrate 201 (FIG. 4). Namely, a configuration has been adopted in which, when the front unit 22 is removed from the apparatus body 20, the main power switch 6 and the USB connector 11 can be left in the body 20 regardless of the removal of the front unit 22. Thereby, for example in removal of the front unit 22 from the body 20 for replacement of the back light 223, the main power switch 6 can be kept in an ON state. Therefore, while measured data continue to be collected in the waveform observing apparatus 1, an operation to replace an element incorporated in the front unit 22, typically, the replacement of the back light 223 or the liquid display 224, can be performed. In other words, elements restricted to two functions, a display function and an input function (touch panel 222), are incorporated in the front unit 22, and hence the measured data collecting function of the waveform observing apparatus 1 can be continued even when the front unit 22 is removed from the body 20.

Figure 5:
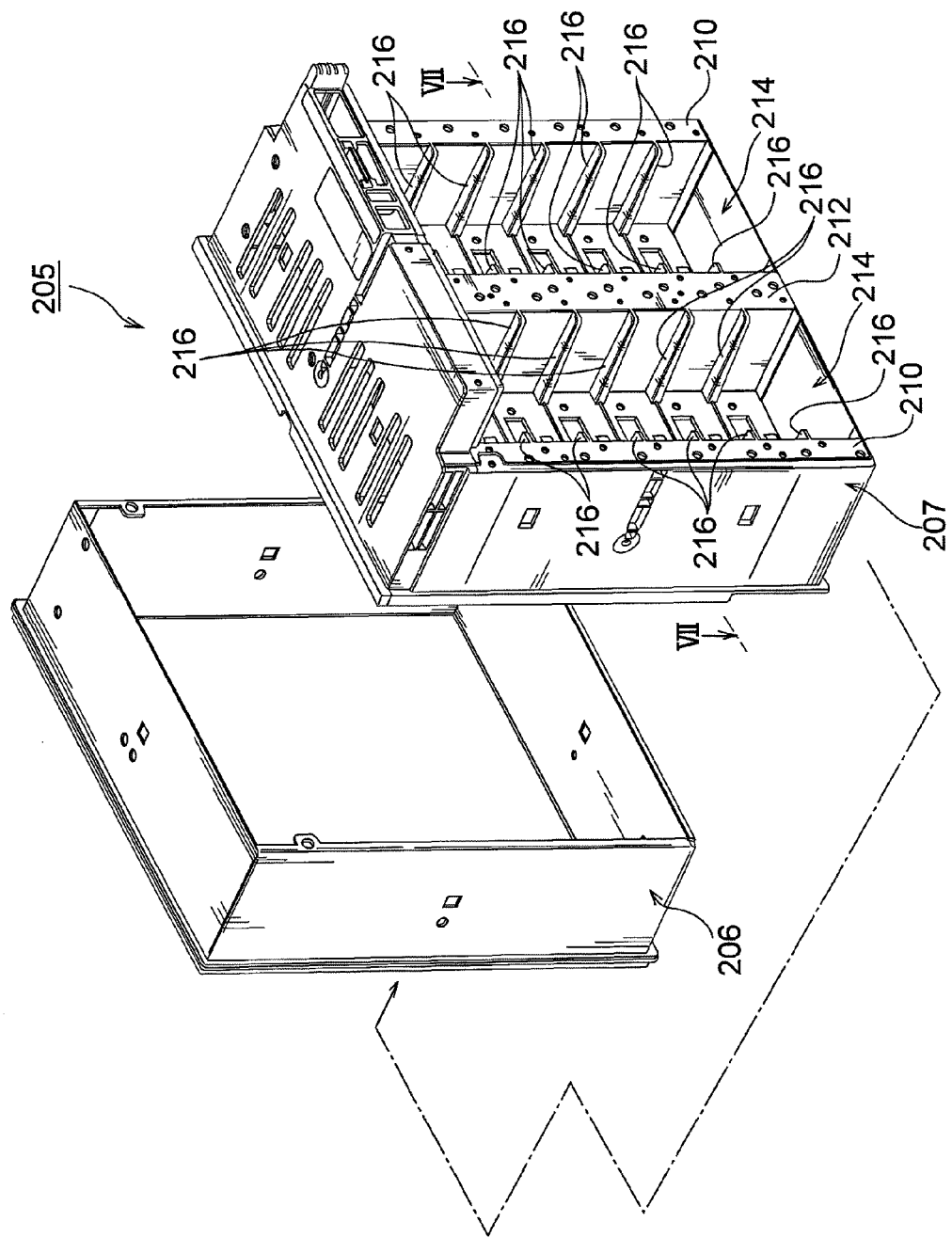
FIG. 5 is an exploded perspective view of a body frame of the waveform observing apparatus.

With reference to FIG. 3, as detailed later, the box-shaped-body frame 205 having a rectangular cross-section and an open front and rear surfaces is made up of a metal-made outer frame 206 as an outer covering and an inner plastic frame 207 as a main constituent, thereby reducing the weight of the body frame 205. In the plastic frame 207, multistage shelves in two right and left columns for housing measurement units 23 and alarm or IO units 24 are formed (FIG. 5). It goes without saying that the configuration of the two right and left columns shown in the figure is a mere example, and the configuration may be formed of three right and left columns, or one column.

In the body frame 205 included in the embodiment, the measurement units 23 that are housed on the shelves except for the top two stages of shelves and the alarm or IO units 24 that are housed on the top two stages of shelves can be connector-connected by being inserted onto the shelves of the plastic frame 207 from its rear side. Namely, the relay substrate 201 that is located in the erect state ahead of the plastic frame 207 is installed with the connectors 203, 204 in positions associated with the respective shelves of the plastic frame 207, and the measurement units 23 and the alarm or IO units 24 can be connector-connected by being inserted onto the respective shelves of the plastic frame 207.

The measurement unit 23 and the alarm or IO units 24 are respectively installed with terminal boards 25 on the rear surfaces thereof (FIG. 4), and the terminal board 25 of the measurement unit 23 is connected with wiring from a variety of sensors 27 such as a thermocouple, a resistance temperature sensor, a flow meter and a pressure sensor. Upon receipt of a signal from the sensor 27, an intra-unit microcomputer 28 communicates with a CPU 29 of the main substrate 202 through the relay substrate 201, and transmits measured data received from the sensor 27 to the main substrate 202.

Namely, in the measurement unit 23, a measurement signal from the sensor 27 is converted into a digital signal, and this digital signal is supplied to the main substrate 202 through the relay substrate 201. The CPU 29 of the main substrate 202 serves to control the whole of the waveform observing apparatus 1. The CPU 29 of the main substrate 202 performs signal processing in accordance with a predetermined program to store measured data into the body memory 31 in a predetermined cycle, and also generates an image signal for controlling drawing of the display section 2. The main substrate 202 and the display section 2 are connected with each other through the relay substrate 201. When the operator touches the touch panel 222, a touched position signal or a coordinate signal, which corresponds to the touch, is supplied from the touch panel 222 to the CPU 29 of the main substrate 202, and the CPU 29 realizes a function meant by a key corresponding to the touched place, or generates a signal for executing scroll of a waveform on display in the display section 2 based upon the coordinate signal.

The waveform observing apparatus 1 is installed into a control box 32 (FIG. 4) at the factory and can be connected to a personal computer 34 through an intra-factory LAN 33. The personal computer 34 can display the same waveform as the waveform on display in the waveform observing apparatus 1. Further, a copy of data stored in the body memory 31 of the waveform observing apparatus 1 can be retrieved by inserting the USB memory 35 as a removable recording medium into the USB connector 11.

With reference to FIG. 5, as described above, the box-shaped body frame 205 of the apparatus body 20 is made up of the inner plastic frame 207 as the main constitute and the metal frame 206 as the outer covering, and the inner plastic frame 207 has an outer shape with an outline complementary to a rectangular outline of the metal frame 206. The body frame 205 is assembled by inserting the inner plastic frame 207 into the metal frame 206 from its front surface side, whereby the body frame 205 has an outer/inner double frame structure formed of the plastic frame 207 as the main constitute and the metal frame 206 surrounding the outside of the plastic frame 207 as a structural main constitute.

When seen from its rear side, the inner plastic frame 207 has right and left vertical outer walls 210, and a vertical central wall 212 that is located at the middle point between the outer walls 210 and vertically extends. Between the central wall 212 and the right and left outer walls 210, insertion spaces 214 are respectively formed which extend in the longitudinal direction and longitudinally align the measurement units 23 and the alarm or IO units 24. On the right and left outer walls 210 and the central wall 212 along the wall surfaces, which define the right and left insertion spaces 214, a plurality of guiding projection 216 extending in the cross direction are integrally molded. These guiding projections 216 constitute substantial shelves that allow the measurement units 23 and the alarm or IO units 24 to be housed in a vertically aligned state in the right and left insertion spaces 214. More specifically, in the right and left insertion spaces 214, the modules 230 excluding the terminal boards 25 of the measurement units 23 and the alarm or IO units 24 are housed.

As described above, needless to add, the body frame 205 is not restricted to the module insertion spaces 214 in two right and left columns. For example, providing two vertical central walls 212 can form the insertion spaces 214 laterally in three columns. On the contrary, omitting the central wall 212 can form the single module insertion space 214 by the right and left vertical outer walls 210.

As a modified example, the configuration of the vertical central wall 212 may be changed to a configuration extending in the lateral direction, to form the module insertion spaces 214 extending in the horizontal direction, so as to get the plurality of measurement units 23 and alarm or IO units 24 aligned in the lateral direction, namely aligned alongside.

Figure 7:
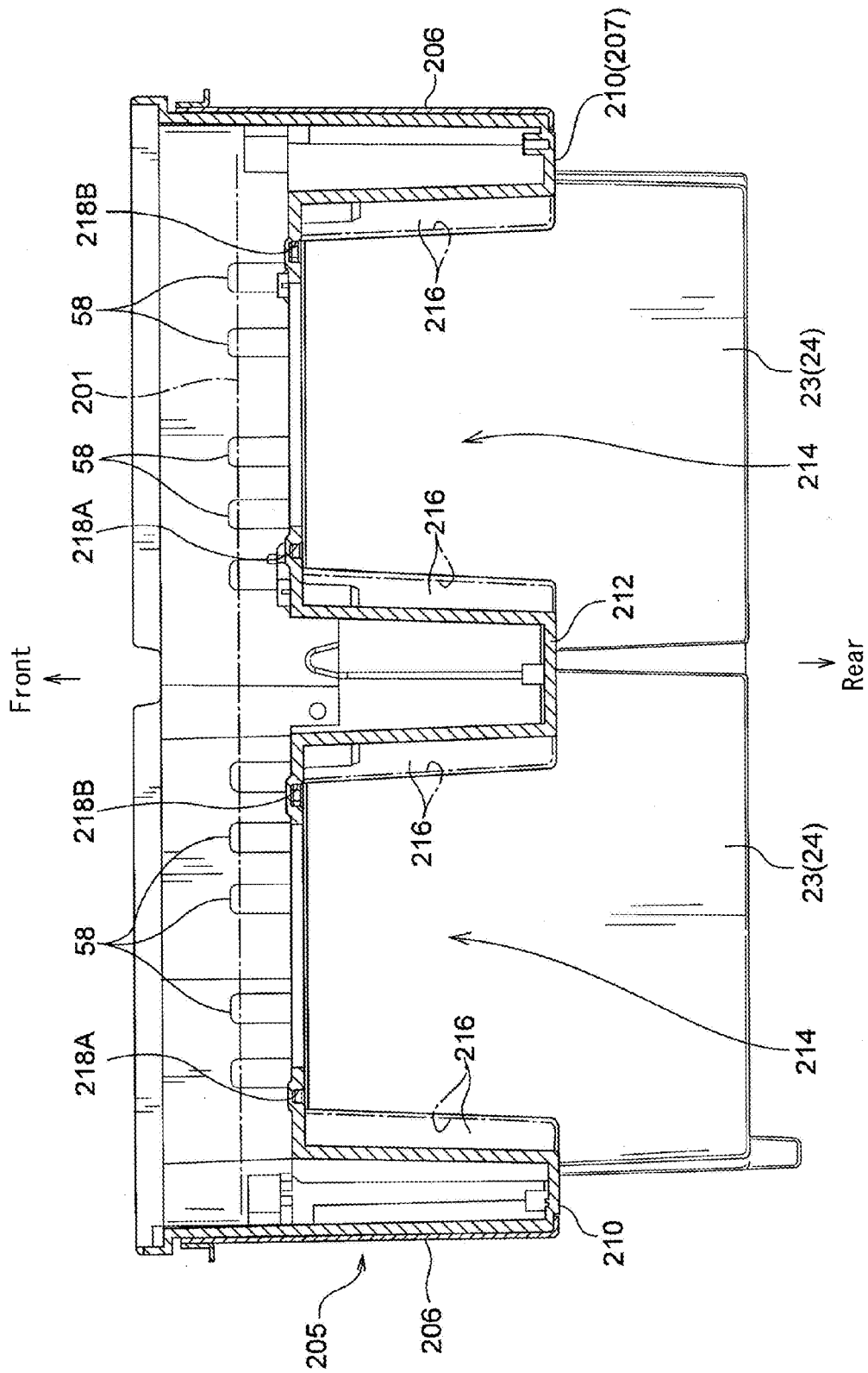
FIG. 7 is a horizontal sectional view of the body frame.

FIG. 7 is a cross-sectional view of the body frame 205. As understood from FIG. 7, the inner plastic frame 207 has a substantially symmetrical concavo-convex shape for forming the module insertion spaces 214 by the right and left outer walls 210 and the central wall 212, and the right and left outer walls 210 and the central wall 212 have substantially the same widths and thicknesses. Namely, the inner plastic frame 207 are molded in concavo-convex shape, thereby forming the outer walls 210 and the central wall 212 both having widths and the right and left module insertion spaces 214, and on the right and left outer walls 210 and the central wall 212, rib-shaped guiding projections 216 are integrally molded in the shifting direction of the measurement unit 23, namely in the cross direction and the horizontal direction. As thus described, with the inner plastic frame 207 integrally molded three-dimensionally in concavo-convex shape, it is possible to ensure structural rigidity. Further, it can be said that a plurality of guiding projections 216 that extend in the horizontal direction and serve to guide the measurement units 23 also contribute to ensuring the rigidity of the inner plastic frame 207.

Reference numeral 218 shown in FIG. 7 denotes positioning holes for the measurement unit 23 and the alarm or IO unit 24. A pair of positioning holes 218 are provided right and left with a space therebetween with respect to each unit 23 (24) in the deep portion of the module insertion space 214. One positioning hole 218A is made up of small holes, and the other positioning hole 218B is made up of a long hole extending in the lateral direction.

Figure 8:
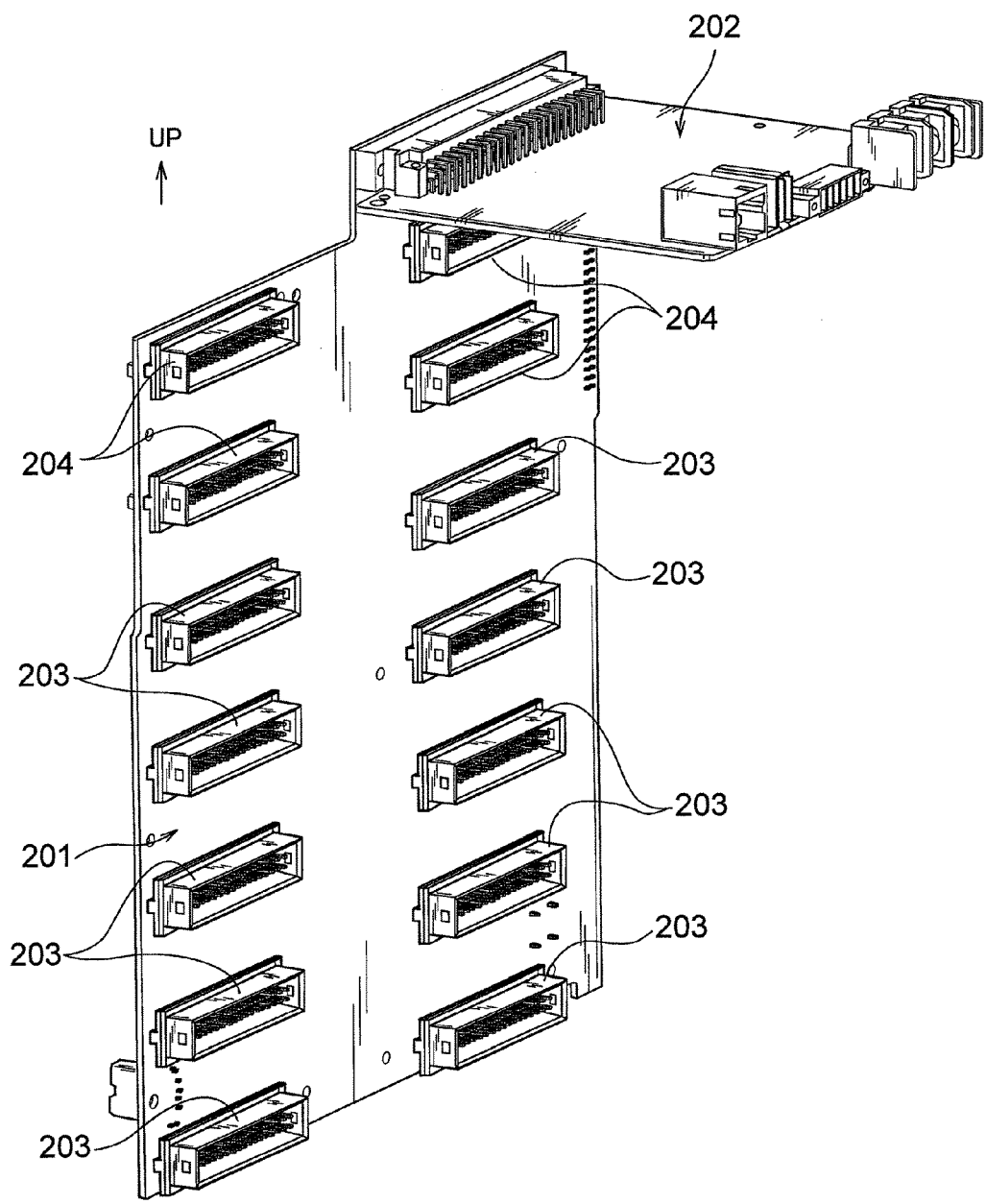
FIG. 8 is a view showing the relay substrate incorporated in an erected state into the body frame, and the main substrate connector-connected to the upper end of the relay substrate.

FIG. 8 is a perspective view where the foregoing relay substrate 201 positioned in the vertically erect state and the main substrate 202 positioned in the state of being the connector-connected to the upper end of the relay substrate 201 and extending backward in the horizontal direction have been extracted. This perspective view is a view obliquely seen from the rear. The relay substrate 201 is installed on the front surface portion of the body frame 205, and the main substrate 202 is installed on the upper end of the body frame 205. With the relay substrate 201 positioned in the vertically erect state, the depth size of the waveform observing apparatus 1 can be made smaller than the conventional one. For the reference's sake, the depth size of the waveform observing apparatus 1 of the embodiment is about two-thirds of that of the conventional apparatus. Further, installing the main substrate 202 above an arranged position of the measurement unit 23, preferably at the upper end of the body frame 205, can reduce an influence on the measurement unit 23 exerted due to heat generated by the main substrate 202.

Figure 9:
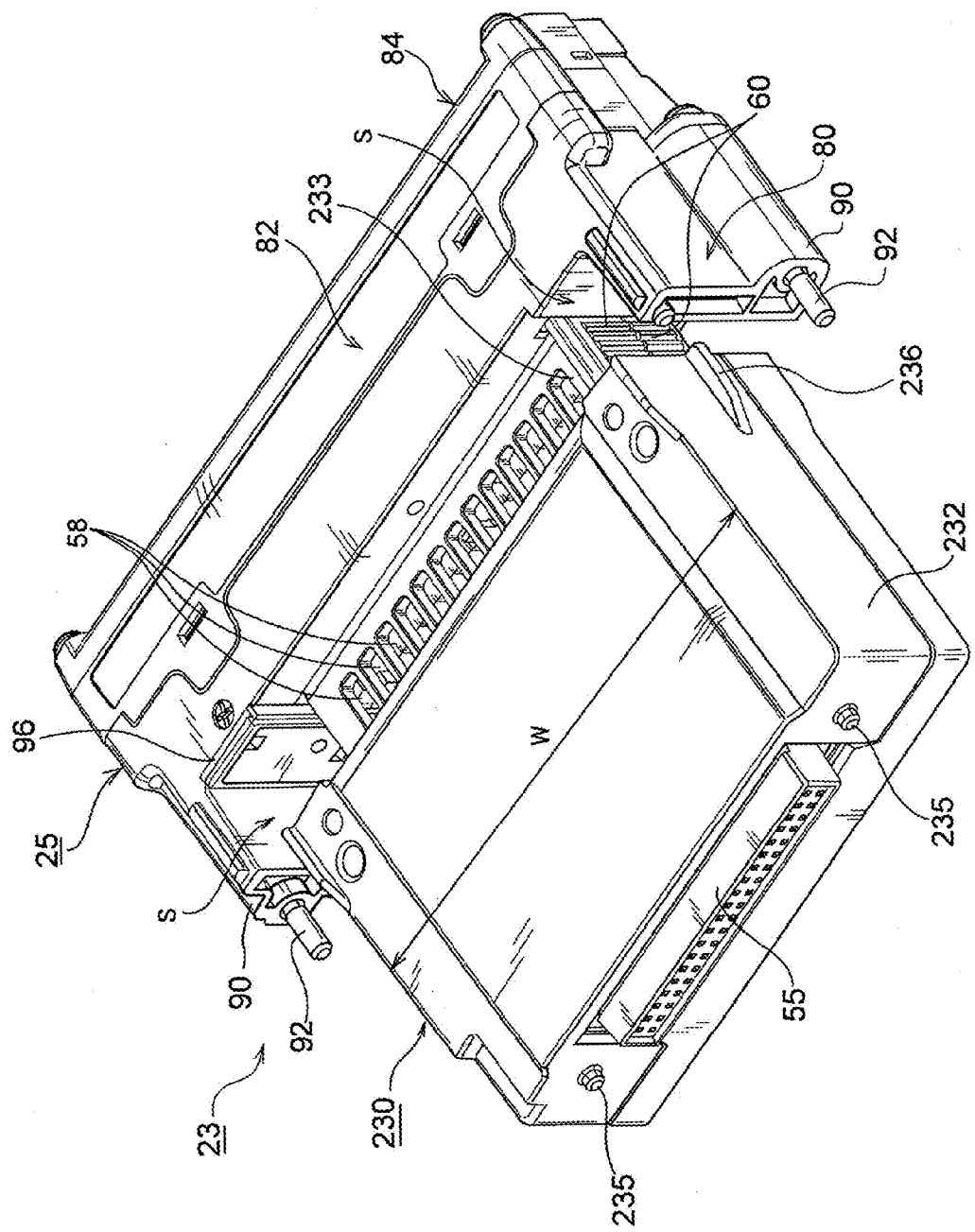
FIG. 9 is a perspective view of a vertically flipped measurement unit.
Figure 10:
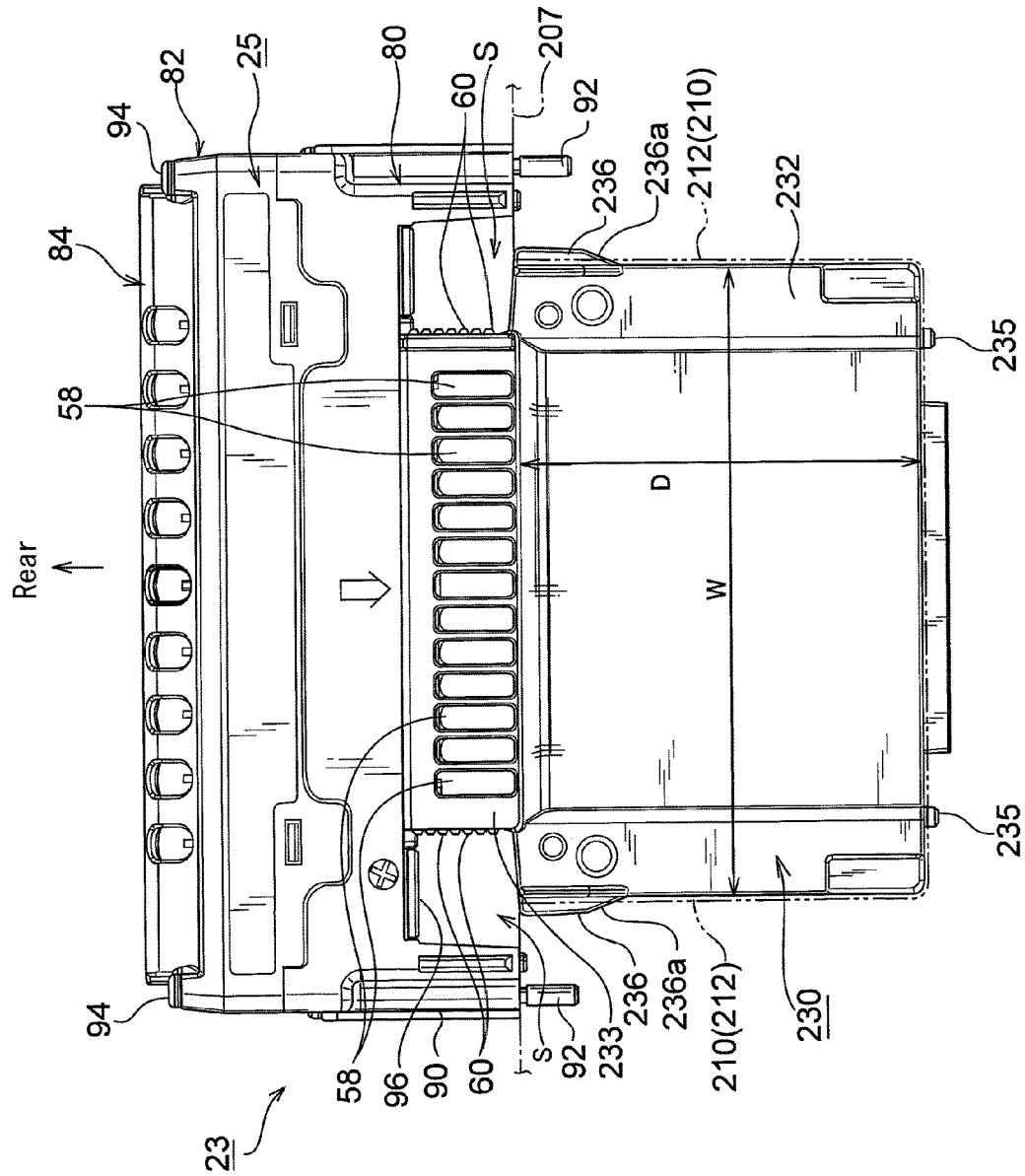
FIG. 10 is a plan view of the measurement unit.

FIG. 9 is a perspective view of the vertically flipped measurement unit 23, namely, a view of the measurement unit 23 seen from the bottom, and FIG. 10 is a plan view of the same. The alarm or IO unit 24 has substantially the same appearance. The measurement unit 23 is made of the measurement module 230 and the terminal board 25. The measurement module 230 and the terminal board 26 are connector-connected to each other, and thereby the terminal board 26 is detachable with respect to the measurement module 230.

Figure 6:
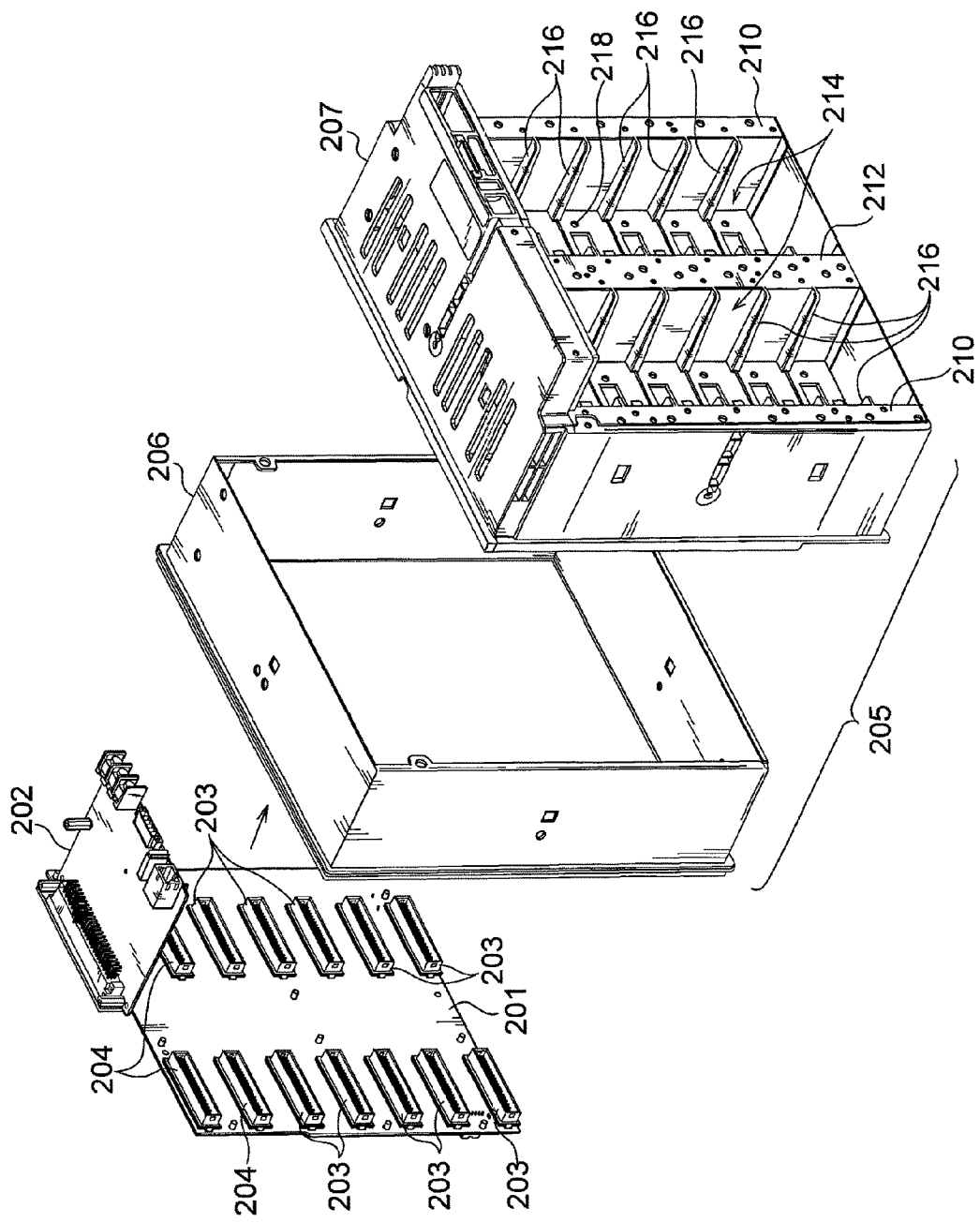
FIG. 6 is an exploded perspective view of the body frame including a relay substrate and a main substrate.

The measurement module 230 includes: a module body 232 having a width size W and a depth size (FIG. 10) which are substantially the same as those of the module insertion space 214 of the apparatus body 20 (FIGS. 6 and 7); a ventilation section 233 having a small width and extending backward from the rear end of the module body 232; and right and left positioning pins 235 extending forward from the front end surface of the module body 232. The ventilation section 233 is installed at the central portion in the width direction of the module body 232.

When the measurement unit 23 is inserted into the module insertion space 214, the positioning pin 235 gets into the foregoing positioning hole 218 (FIG. 7), thereby positioning the measurement unit 23.

The module body 232 with the width W substantially the same as the width of the module insertion space 214 of the apparatus body 20 has a pair of right and left horizontal ribs 236 that project outward in the width direction from the rear end on both side surfaces of the module body 232, and the front end of the horizontal rib 236 is made up of a taper surface 236a (FIG. 10). This horizontal rib 236 has a function of inserting the measurement unit 23 into the module insertion space 214 and also guiding the move of the measurement unit 23 upon removing the measurement unit 23 from the module insertion space 214 by being friction-bonded to the upper surface of the guiding projection 216 of the inner plastic frame 207, and also has a function of getting the measurement unit 23, inserted into the module insertion space 214, latched to the guiding projection 216.

Figure 11:
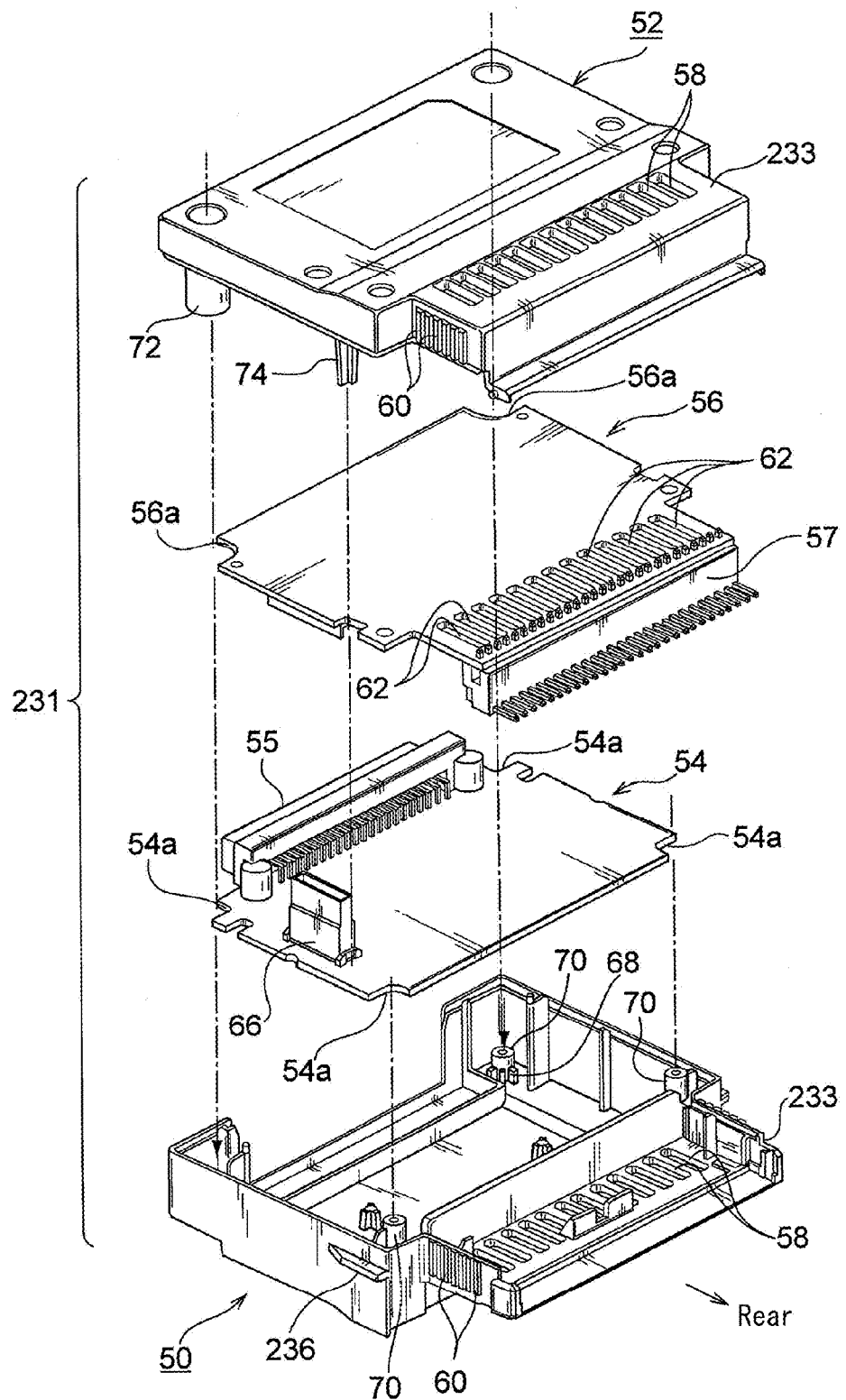
FIG. 11 is an exploded perspective view of a measurement module constituting part of the measurement unit.

FIG. 11 is an exploded perspective view of the measurement module 230. The measurement module 230 has a lower case 50 and an upper case 52 which are vertically separable from each other. In an inner space formed by this lower and upper cases 50, 52, a lower substrate 54 and an upper substrate 56 separate from the lower substrate 54 are housed. These vertically separated substrates 54, 56 are both made of a metal material excellent in thermal conductivity. The lower substrate 54 is mounted with a body-side connector section 55 at its front end edge, and this lower substrate 54 is connector-connected to the apparatus body 20. Meanwhile, the upper substrate 56 is connected with a terminal board-side connector 57 at its rear end, and this upper substrate 56 is connector-connected to the terminal board 25.

As described above, the measurement module 230 has the ventilation section 233 (FIG. 10) with a width and height sizes relatively smaller than those of the module body 232. This ventilation section 233 has, in corresponding portions of the lower and upper cases 50 and 52, a plurality of vertically penetrating first ventilation openings 58 and second ventilation openings 60 penetrating in the lateral direction. The first ventilation openings 58 are arranged as vertically aligned with respect to the lower and upper cases 50, 52. Namely, the measurement module 230 is ventilated in four directions, the upward and downward directions and the directions to the right and left, in the ventilation section 233 through the plurality of first ventilation openings 58 which are formed in the lower and upper cases 50, 52 and aligned in a plan view, and the plurality of right and left second ventilation openings 60.

As a preferred mode, the thermal conductive upper substrate 56 has a plurality of third ventilation openings 62 in a portion corresponding to the ventilation section 233 of the measurement module 230, and the third ventilation openings 62 are aligned with the first ventilation openings 58 of the foregoing lower and upper cases 50, 52 in a plan view.

With reference to FIG. 11, a fitting structure of the two vertically separated substrates 54, 56 is described. The lower substrate 54 and the upper substrate 56 are connected with each other by a connector 66 mounted on one side of the lower substrate 54 and the upper substrate 56. It is to be noted that, although only the connector 66 on the lower substrate 54 side is shown in relation to drawing of this figure, another connector engaged with the lower-substrate-side connector 66 is mounted on the upper substrate 56.

In the lower case 50, mounts 68 are formed in its four corners, and four corners of the lower hinge 54 are seated on these four mounts 68. Further, in the lower case 50, respective first bosses 70 are formed adjacently to the mounts 68 in the four corners, and in association with this, notch sections 54a are formed in four corners of the lower substrate 54. The notch section 54a is located adjacently to the first boss 70, so as to position the lower substrate 54 while allowing upward and downward, right and left movements of the lower substrate 54 to a certain degree.

Meanwhile, the upper case 52 is provided with respective second bosses 72 in two corners of its front end. This second boss 72 has a diameter larger than that of the first notch section 54a of the lower substrate 54. The second boss 72 is engaged with a periphery of the lower substrate 54 from the top, thereby to restrict lifting of the front portion of the lower substrate 54. Further, the upper case 52 is provided with a pair of right and left projections 74 at its rear end, which are separated right and left and extend downward. The lower end of the projection 74 is located adjacently to the lower substrate 54, so as to restrict lifting of the rear portion of the lower substrate 54. It is to be noted that the body-side connector section 55 is provided at the front end edge of the lower substrate 54, as described above.

Meanwhile, the upper substrate 56 is provided with second notch sections 56a in two corners of its front end. The second boss 72 of the upper case 52 is inserted with clearance into this second notch section 56a, and thereby the front end of the upper substrate 56 is positioned freely movably right and left and forward and backward in a fixed range. Further, at the rear end of the upper substrate 56, third notch sections 56b are formed which take the restricting projections 74 for controlling lifting of the lower substrate. This third notch section 56b is larger than the restricting projection 74, and thereby, the rear end of the upper substrate 56 is positioned freely movably right and left and forward and backward in a fixed range. It should to be noted that the upper case 52 is provided with a projection (not shown) for controlling excess lifting of the upper substrate 56 while allowing the lifting in a fixed range.

With the above configuration, the lower substrate 54 provided with the body-side connector section 55 and the upper substrate 56 provided with the terminal board-side connector section 57 are both supported as floated inside the lower and upper cases 50, 52, and further, relative displacement of the lower substrate 54 and the upper substrate 56 is allowed in a fixed range.

Figure 12:
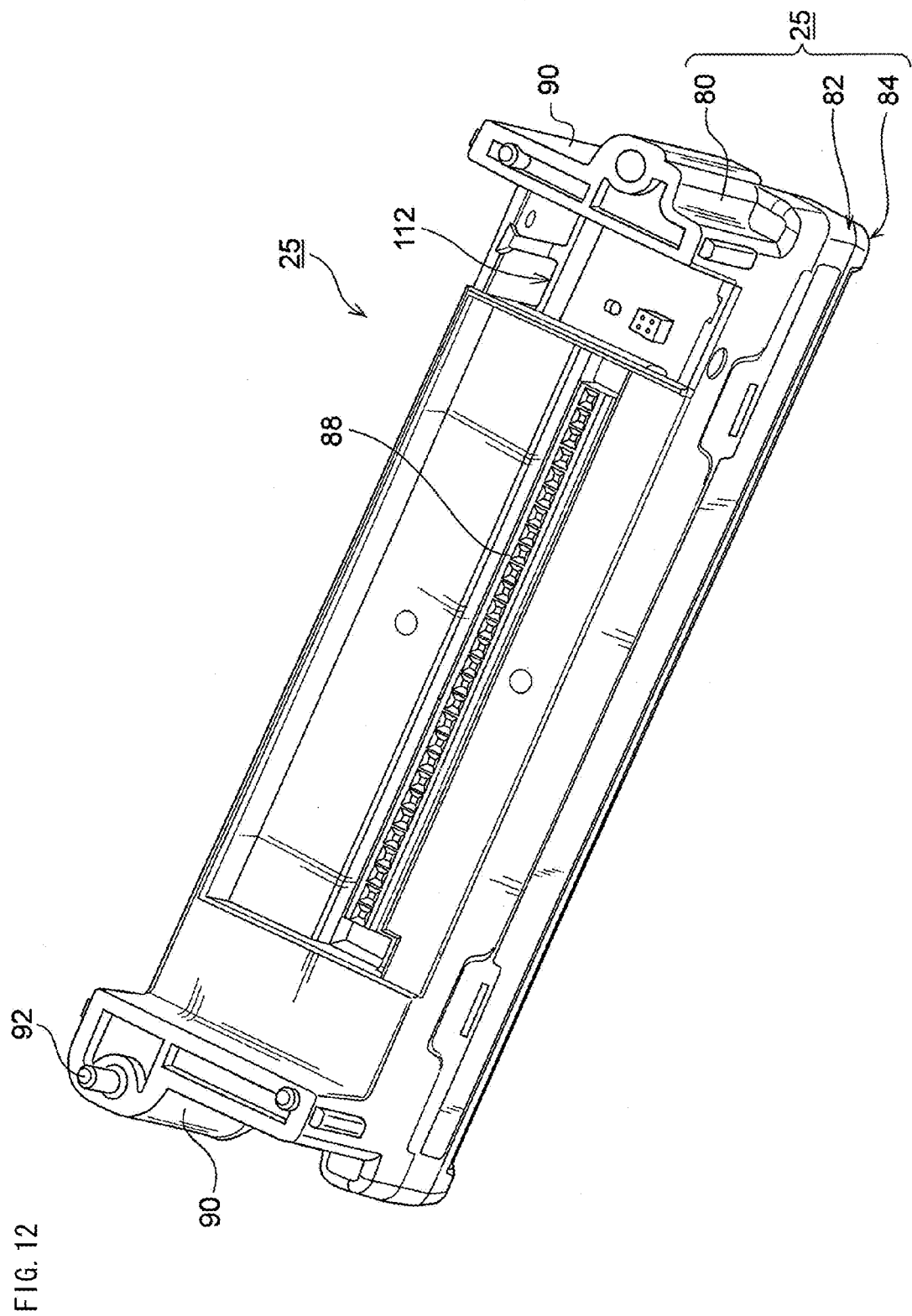
FIG. 12 is a perspective view of a terminal board, seen from the measurement module side, which is detachably connected to the measurement module to constitute part of the measurement unit.
Figure 13:
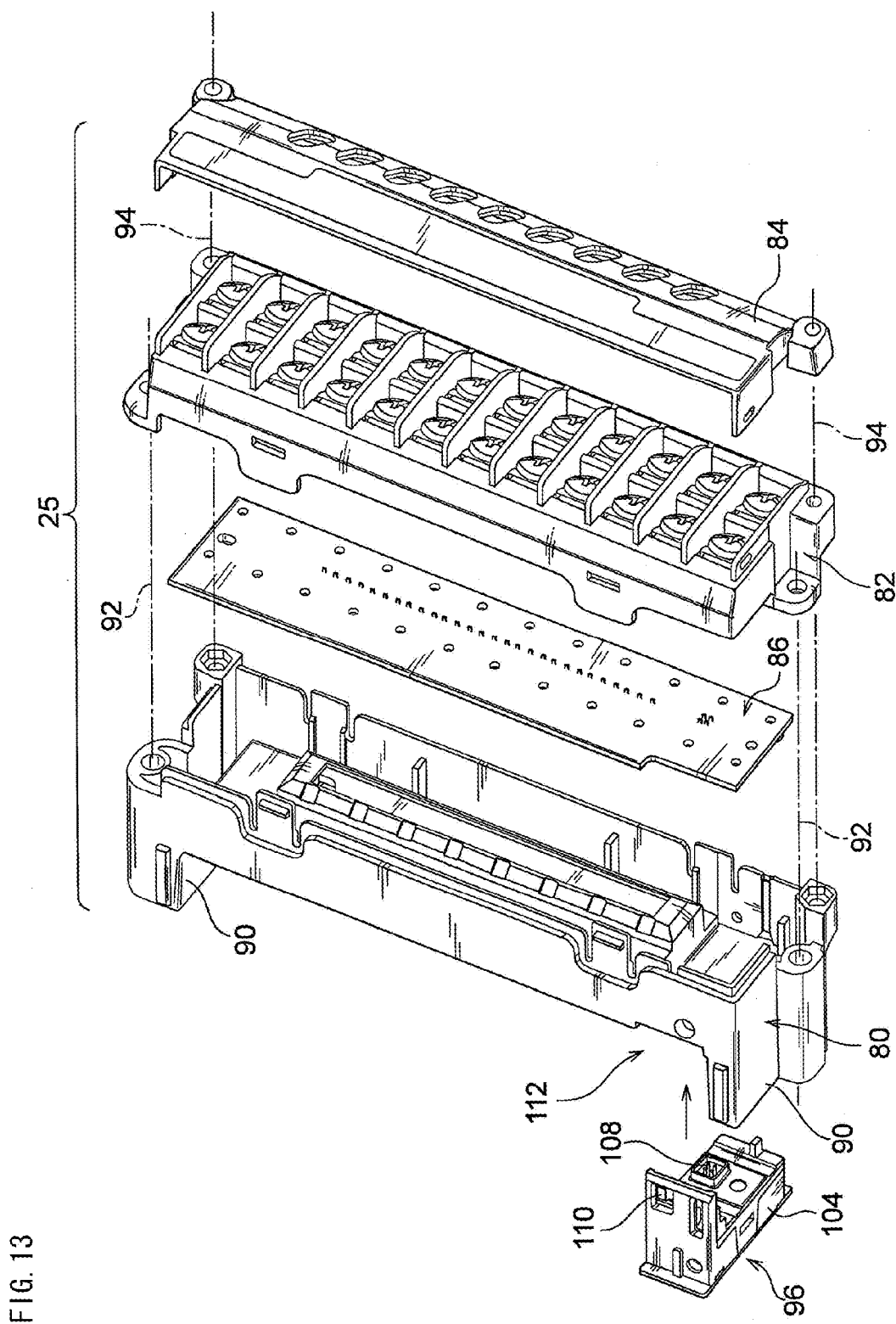
FIG. 13 is an exploded perspective view of the terminal board.

FIG. 12 is a perspective view of the terminal board 25 seen from the measurement module 230 side, and FIG. 13 is an exploded perspective view of the same. With reference to FIG. 13, the terminal board 25 has a terminal board base 80, a terminal board body 82, and a terminal board cover 84. The terminal board 25 has the terminal table cover 84 between the terminal board base 80 and the terminal board body 82, and a substrate 86 is housed between the terminal table base 80 and the terminal table body 82. The substrate 86 extending along the terminal board body 82 is provided with a connector section 88 (FIG. 12). The terminal board 25 is connector-connected to the measurement module 230 by engagement of its connector section 88 with the terminal board-side connector section 57 of the measurement module 230, to form the measurement unit 23 (FIGS. 9 and 10).

Figure 14:
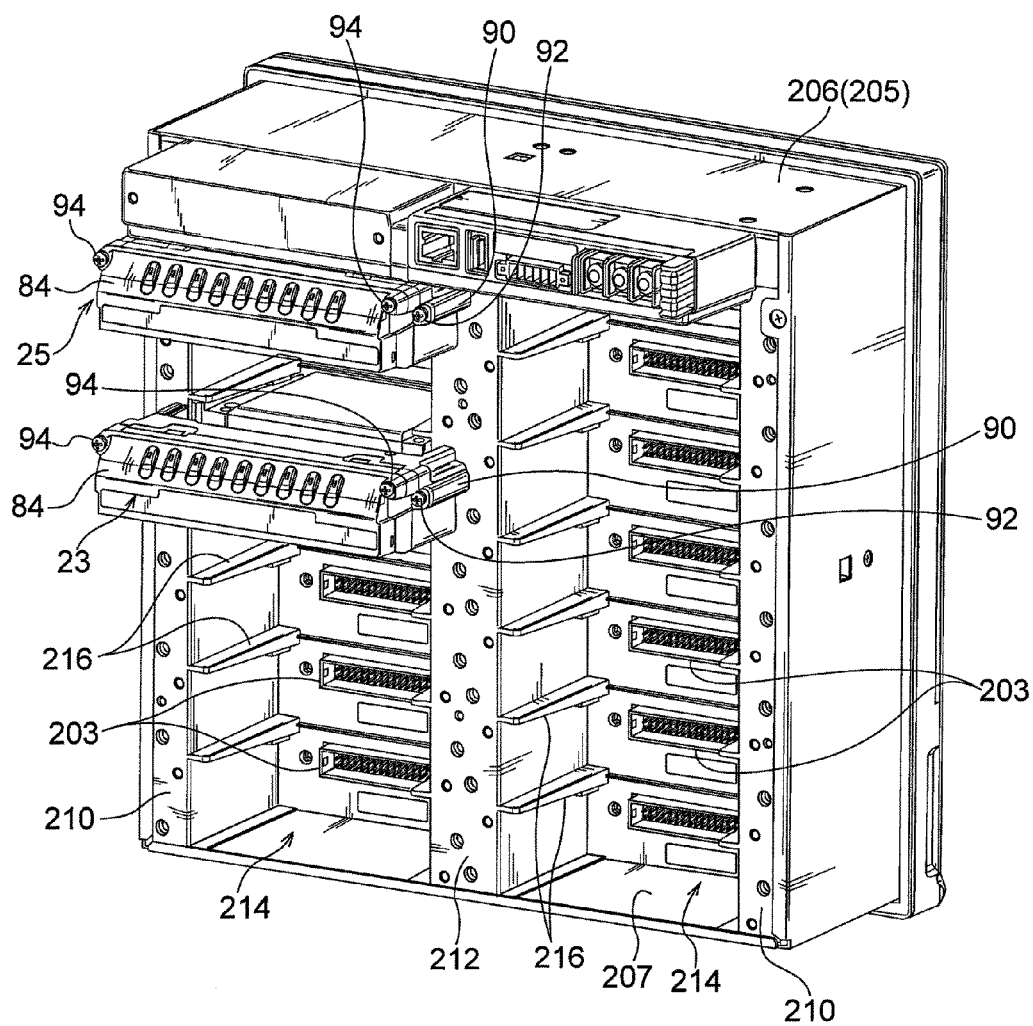
FIG. 14 is a view of a waveform observing apparatus of an embodiment seen from the rear.
Figure 15:
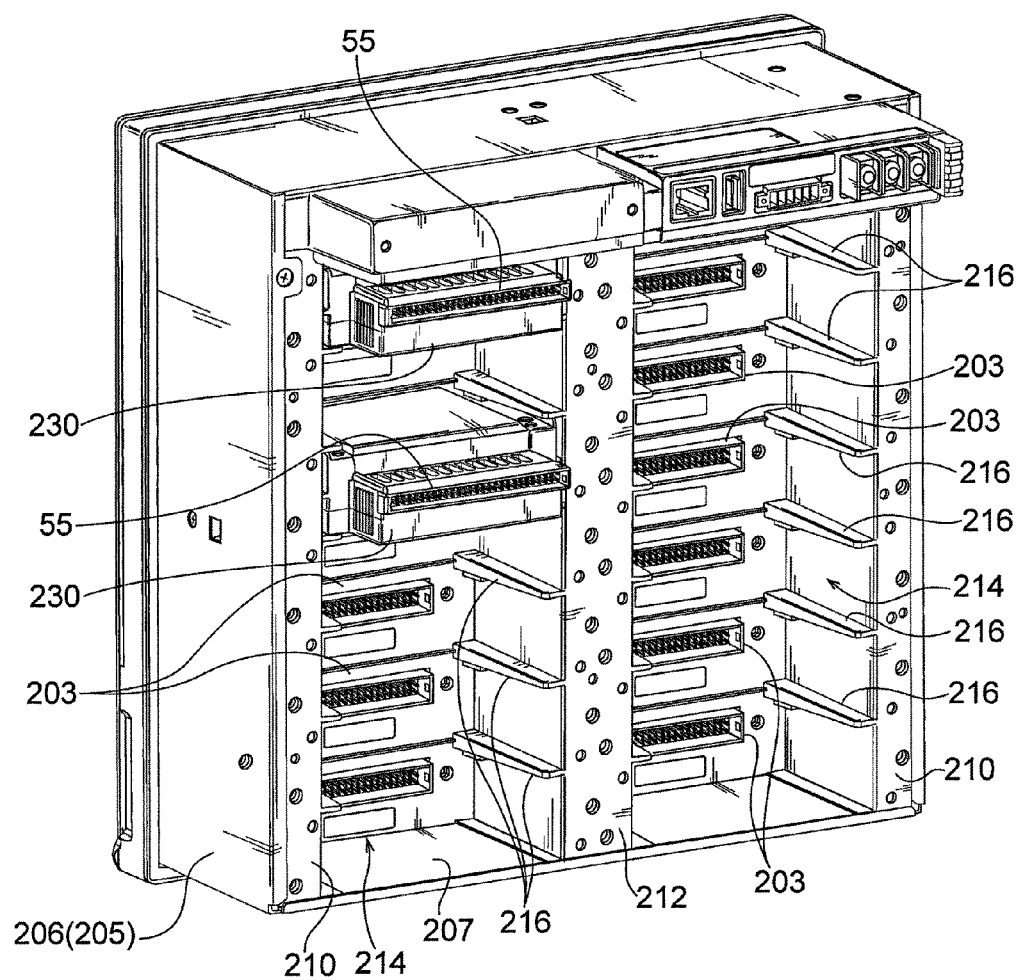
FIG. 15 is a view drawn with the terminal board omitted from the waveform observing apparatus of FIG. 14.

FIG. 14 shows a state where the measurement unit 23 has been mounted in the apparatus body 20, and FIG. 15 shows a state where the terminal board 25 has been removed from the measurement unit 23 in the apparatus body 20 as in FIG. 14. As most obvious from FIGS. 9 and 10 described above, the terminal board 25 is designed to have a longitudinal size larger in the direction of the width W than that of the measurement module 230, project right and left from the measurement module 230, and has right and left ends seated on the right and left outer walls 210 of the rear surface of the body frame 205 (inner plastic frame 207) and the central wall 212 of the body frame 205.

Namely, the terminal board base 80 has, at its both longitudinal ends, a pair of legs 90 extending toward the apparatus body 20 side, and the end surfaces of the legs 90 can be seated on the right or left outer wall 210 and the central wall 212 of the body frame 205.

As most apparent from FIGS. 9 and 10, the pair of right and left legs 90 of the terminal board base 80 are located separately from the ventilation section 233 of the measurement module 230, thereby forming an opening space S for heat generation extending upward and downward between each of the right and left legs 90 and the ventilation section 233.

With reference to FIG. 13, the terminal board base 80 is fixed to the body frame 205 by a pair of first bolts 92 to be inserted into the legs 90, and also the terminal board body 82 is detachably joined to the terminal board base 80 by use of the first bolts 92. Meanwhile, the terminal board cover 84 is detachably joined to the terminal board body 82 by use of second bolts 94.

For example in temperature measurement, the waveform observing apparatus 1 regularly performs a test on an input section for a measurement signal for keeping the accuracy of an input signal, namely a detected temperature. Since the measurement unit 23 included in the embodiment is detachable with respect to the apparatus body 20 and the terminal board 25 is detachable with respect to the measurement module 230, by removing the measurement module 230 to be tested from the apparatus body, installing the terminal board 25 in the measurement module 230 for replacement which was previously prepared, and also installing the replacement terminal board 25 in the apparatus body 20, it is possible to immediately resume measurement by use of this replacement measurement module 230. In other words, while the state of wiring connection between the terminal board 25 and the external equipment is held, the measurement module 230 needed testing can be removed simply by replacement of only the measurement module 230 with the replacement measurement module 230. The measurement module 230 needed testing may be subjected totesting and temperature calibration in an actual place, or may be sent to an agency provided with dedicated equipment.

Figure 16:
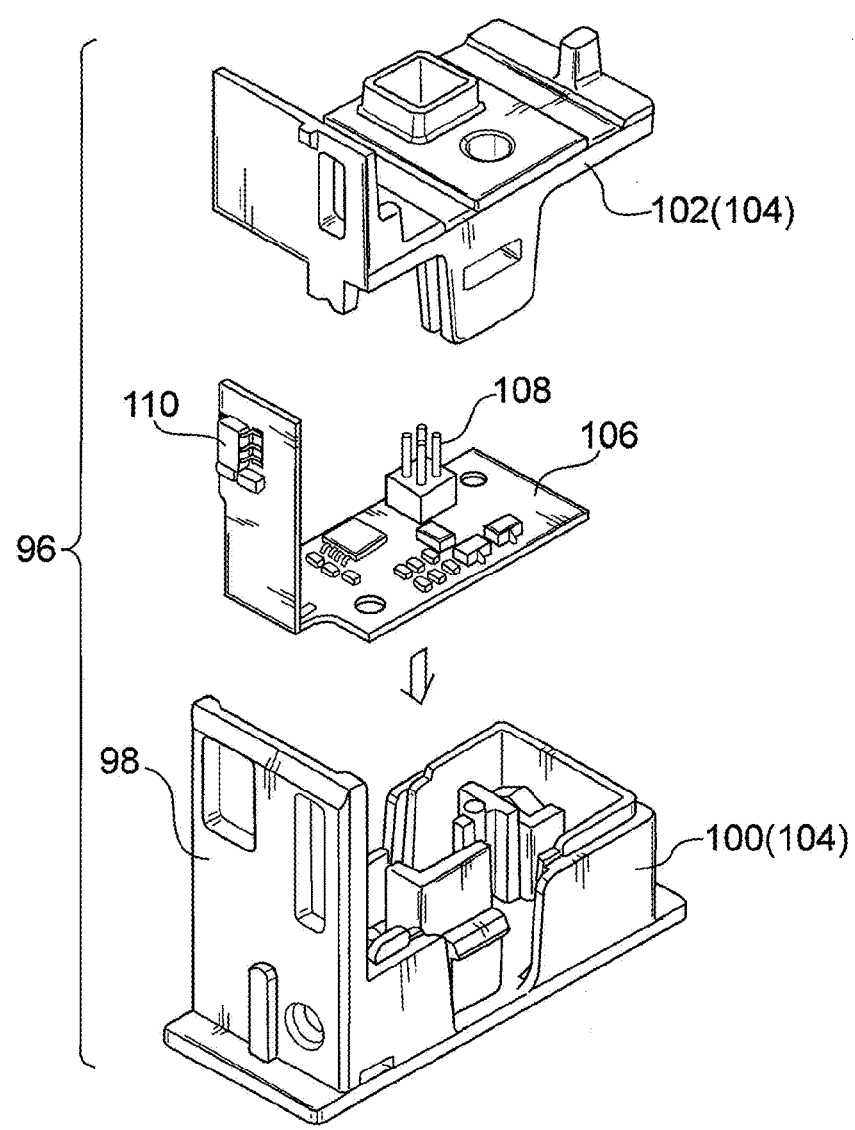
FIG. 16 is an exploded perspective view of a temperature sensor unit to be mounted on the terminal board.

With reference to FIG. 13 again, a temperature sensor unit 96 can be built into the terminal board 25. In other words, the temperature sensor unit 96 can be detachably mounted on the terminal board 25. FIG. 16 is an exploded perspective view of the temperature sensor unit 96.

With reference to FIG. 16, in the temperature sensor unit 96, a case 104 is made up of a box-shaped base member 100 having an erect wall 98 and an upper lid 102 that is fixed to the base member 100, and a substrate 106 is housed inside the case 104. The substrate 106 has a connector 108, and is connected to the substrate 86 (FIG. 13) of the terminal board 25 by use of this connector 108.

The substrate 106 of the temperature sensor unit 96 has a substrate extended section 106a extending along the erect wall 98 of the base member 100 (FIG. 16). The upper end of the substrate extended section 106a extends outward from the case 104, and a temperature sensor IC 110 is installed on the upper end of this substrate extended section 106a. This temperature sensor IC 110 gets into the inner space of the terminal board 25 surrounded by the terminal board base 80 and the terminal board body 82 for housing the substrate 86 along with the erect wall 98, whereby an atmosphere temperature of the substrate housing space of the terminal board 25 is detected by use of the temperature sensor IC 110.

As most apparent from FIG. 13, the temperature sensor unit 96 is preferably installed in a position adjacent to the one leg 90 and also bordering the open space S with the measurement module 230. Although FIG. 12 shows the terminal board 25 in a state where the user setting key button 9 is not mounted thereon, a portion where the user setting key button 9 is to be denoted by reference numeral 112.

Since the temperature sensor unit 96 is detachable with respect to the terminal board 25 and the temperature sensor unit 96 can be removed by access from the outside, in order to check or test the accuracy of the temperature sensor unit 96, removing the temperature sensor unit 96 to be tested from the terminal board 25 and mounting the temperature sensor unit 96 for replacement on the terminal board 25 allows immediate continuation of measurement.

According to the waveform observing apparatus 1 of the embodiment, since the body frame 205 is made up of the inner plastic frame 207 as the main constituent and is formed by a three-dimensional special structure having the right and left outer walls 210 and the central wall 212 of the inner plastic frame 207, it is possible to ensure the rigidity while reducing the weight of the waveform observing apparatus 1 as compared with the conventional case where the body frame 205 is singly made of metal. Further, the rib-shaped guiding projections 216 integrally molded on the outer walls 210 and the central wall 212 can also enhance the rigidity of the inner plastic frame 207. Moreover, fixing both the right and left ends of the terminal board 25, extending over the outer walls 210 and the central wall 212, to the outer walls 210 and the central wall 212 allows the terminal board 25 to further enhance the rigidity of the body frame 205.

According to the waveform observing apparatus 1 of the embodiment, since the measurement unit 23 can be detached with respect to the apparatus body 20 in a cassette system, a user having acquired the waveform observing apparatus 1 can additionally provide or remove the measurement unit 23 in the case of an increase/decrease in the number of channels depending upon circumstances after the acquirement, so as to adjust the number of channels to an arbitrary number.

Further, with the measurement unit 23 and the relay substrate 201 installed in the erect state, the depth size of the waveform observing apparatus 1 can be reduced as compared with the conventional depth. Moreover, with the main substrate 202 installed backward from the upper end of the relay substrate 201 in the horizontal direction, a thermal influence of the measurement unit 23 exerted due to a heat generated by the main substrate 202 can be suppressed.

Further, the measurement unit 23 in a one-side held state which is connector-connected to the erect relay substrate 201 and extends in the horizontal direction is added with a weight of wiring with the external equipment wiring-connected to the terminal board 25 at its rear end. Since the terminal board 25 constituting part of the measurement unit 23 is fixed to the central wall 212 and either the right or left outer wall 210 of the body frame 205 (inner plastic frame 207), it is possible to improve the supporting rigidity of the terminal board 25. In other word, since a weight load of the rear end of the terminal board 25 can be applied on the body frame 205, it is possible to stabilize inputting/outputting of the waveform observing apparatus 1 that is used for a long period of time by the year.

Further, the measurement unit 23 is made up of the measurement module 230 and the terminal board 25 having a different structure from the measurement module 230. The substrate of the measurement module 230 is made up of the two substrates, the lower substrate 54 and the upper substrate 56. Meanwhile, the one substrate (lower substrate) 54 is provided with the body-side connector section 55, and the other substrate (upper substrate) 56 is provided with the terminal board-side connector section 57, and the floating support structure is adopted in which relative displacement of the other substrate 56 with respect to the one substrate 54 is allowed in a fixed range. Accordingly, this floating support structure can prevent external force applied to the terminal board 25 from reaching the relay substrate 201 of the apparatus body 20, and also seek for thermal insulation between the terminal board 25 and the apparatus body 20 with its configuration in which one of the vertically separated substrates 54, 56 is connected to the terminal board 25 and the other is connected to the apparatus body 20.

Further, not only the measurement unit 23 is made detachable with respect to the apparatus body 20, but the terminal board 25 constituting part of this measurement unit 23 is made detachable with respect to the measurement module 230. Hence, for the purpose of accurate testing on the measurement module 230, the measurement module 230 can be replaced by the replacement measurement module 230 so that only the module body 232 can be removed. Thereby, a measurement operation suspending period of the waveform observing apparatus 1 for periodic checkup of the module body 232 can be held short. It goes without saying that, during the replacement of the module body 232, there is no need for releasing the wiring connection between the terminal board 25 and the external equipment.

Further, with the ventilation section 233 provided between the module body 232 of the measurement module 230 and the terminal board 25, the terminal board 25 and the module body 232 can be thermally insulated from each other, and also heat inside the measurement module 230 can be discharged to the outside. Moreover, since the upper and lower first ventilation openings 58 constituting this ventilation section 233 are aligned in a plan view, an upward gas flow can be made by the first ventilation openings 58, so as to improve thermal dissipation efficiency. Furthermore, since the third ventilation openings 62 aligned with the first ventilation openings 58 in a plan view are provided on the substrate (upper substrate) 56 that receives an input from the terminal board 25, the upper substrate 56 can be air-cooled by the above-mentioned upward gas flow, leading to further efficient thermally insulation from the terminal board 25. Additionally, since the lower and upper substrates 54, 56 installed inside the measurement module 230 are both configured of a substrate made of a metal material excellent in thermal conductivity, it is possible to make thermal dispersion and thermal distributions of the substrates 54, 56 further uniform.

Further, since the second ventilation openings 60 are provided on the right and left side walls of the ventilation section 233, and also the opening space S vertically extending to the right and left of this ventilation section 233 is formed, it is possible to enhance efficiency of thermal dispersion and air cooling of the terminal board 25 and the measurement module 230.

Further, taking the foregoing measure against heat can prevent exertion of an adverse effect on the measured data due to the heat of the terminal board 25. Especially when the objects to be measured by the waveform observing apparatus 1 includes temperature measurement, an error in measured data due to the heat of the terminal board 25 needs to be corrected, but since the heat of the terminal board 25 can be dispersed by the forgoing measure against heat, not only a value to be corrected due to the heat of the terminal board 25 can be made smaller, but also the thermal distribution of the substrate housing space of the terminal board 25 can be made uniform so as to improve the accuracy in temperature detection by the temperature sensor unit 96. Moreover, since the temperature sensor unit 96 is provided in a position bordering the opening space S to the side of the ventilation section 233 so as to detect an atmosphere temperature of the substrate housing space of the terminal board 25 by this temperature sensor unit 96, it is possible to further improve the accuracy in detecting an internal temperature of the terminal board 25.

Further, since the temperature sensor unit 96 can be easily removed by access from the outside, it is possible to readily remove the temperature sensor unit 96 at the time of performing a test on the detection accuracy of the temperature sensor unit 96, and also immediately mount the previously prepared replacement temperature sensor unit 96 on the terminal board 25.

What is claimed is:

1. A waveform observing apparatus, comprising
a terminal board, connecting wiring extending from external equipment,
a memory for receiving measured data through the terminal board, to store the measured data, and
a display for displaying the measured data in waveform,
the apparatus including:
a first intra-body substrate, installed in an erect state inside a body frame of the waveform observing apparatus;
a plurality of first connectors, provided on the first intra-body substrate; and
a measurement module, which is connector-connected to the first connector of the first intra-body substrate, to be installed between the first intra-body substrate and the terminal board, and also includes a measurement circuit,
wherein a plurality of measurement modules are detachable in an aligned state with respect to the erect first intra-body substrate.

2. The waveform observing apparatus according to claim 1, wherein
the measurement module and the terminal board are connector-connected to each other, to constitute a measurement unit, and
the terminal board is detachably fixed to walls of the body frame.

3. The waveform observing apparatus according to claim 2, wherein
a second intra-body substrate is housed in the body frame, other than the first intra-body substrate,
the first intra-body substrate is a relay substrate that supplies the second intra-body substrate with a measurement signal converted into a digital signal in the measurement unit,
the second intra-body substrate is a main substrate that is connector-connected to the upper end of the first intra-body substrate and extends in the horizontal direction, and the main substrate is installed with a control device for controlling the waveform observing apparatus.

4. The waveform observing apparatus according to claim 3, further including a front unit, detachably mountable on the front surface of the body frame, wherein the front unit has a slim-type display, and a main power switch of the waveform observing apparatus is provided on the relay substrate.

5. The waveform observing apparatus according to claim 2, wherein the measurement module houses two intra-module substrates vertically separately disposed inside a module case of the measurement module, out of the two intra-module substrates, one intra-module substrate is installed with a second connector connector-connectable to the intra-body substrate, and the other intra-module substrate is installed with a third connector connector-connectable to the terminal board, and out of the two intra-module substrates, either one is freely movably supported within the fixed range with respect to the module case.

* * * * *